Figure 1:
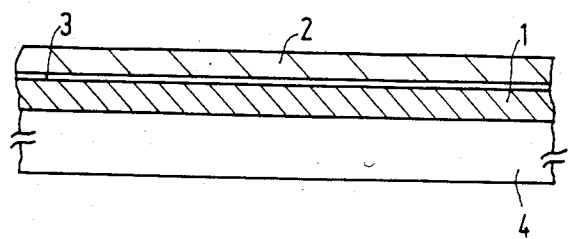
Figure 2:
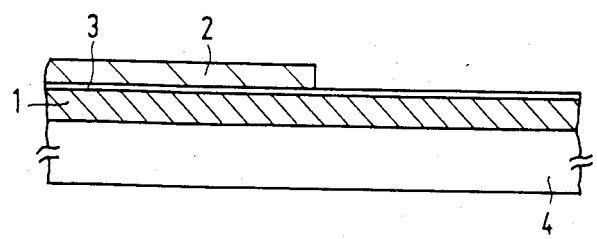

United States Patent [19]

Maas et al.

[11] Patent Number: 4,659,428
[45] Date of Patent: Apr. 21, 1987

[54] METHOD OF MANUFACTURING A SEMICONDUCTOR DEVICE AND SEMICONDUCTOR DEVICE MANUFACTURED BY MEANS OF THE METHOD

[75] Inventors: Henricus G. R. Maas; Johannes A. Appels, both of Eindhoven, Netherlands

[73] Assignee: U.S. Philips Corporation, New York, N.Y.

[21] Appl. No.: 840,164

[22] Filed: Mar. 17, 1986

Related U.S. Application Data

[63] Continuation of Ser. No. 628,373, Jul. 5, 1984, abandoned.

[30] Foreign Application Priority Data

Jul. 15, 1983 [NL] Netherlands ............... 8302541

[51] Int. Cl.$^4$ ............................................. H01L 21/306
[52] U.S. Cl. ......................................... 156/643; 29/571; 29/580; 156/648; 156/653; 156/657
[58] Field of Search ............... 156/643, 653, 654, 657, 156/662, 648, 644, 646; 29/571, 580; 357/24, 55; 427/93, 94; 148/171, 186, 187

[56] References Cited

U.S. PATENT DOCUMENTS 3,767,492 10/1973 MacRae .................. 156/643
4,053,349 10/1977 Simko .................. 29/580 X
4,449,287 5/1984 Maas et al. .................. 156/653 X

FOREIGN PATENT DOCUMENTS 2111304 6/1983 United Kingdom.

Primary Examiner—Kenneth M. Schor
Attorney, Agent, or Firm—Paul R. Miller

[57] ABSTRACT

An improved method of manufacturing a semiconductor device having a narrow groove or slot is provided. There are formed on a substrate a heavily n-doped first silicon layer, an oxidation-preventing layer such as silicon nitride, and a weakly doped or undoped second silicon layer. By means of a single masking step, a part of the second silicon layer is removed, and the remaining part is partially oxidized. The exposed portion of the oxidation-preventing layer is removed without a further masking step by using the oxidized remaining parts of the second silicon layer. Subsequently, the oxide on the second silicon layer is removed. By thermal oxidation, a thin oxide layer is formed on the second silicon layer and an about ten times thicker oxide layer is formed on the first silicon layer. After the exposed oxidation-preventing layer has been etched away, the oxide on the second silicon layer is etched away entirely, and the oxide on the first silicon layer is etched away only superficially. After this, a groove is etched at the removed portions of the exposed oxidation-preventing layer while simultaneously removing the remaining parts of the second silicon layer.

12 Claims, 28 Drawing Figures

METHOD OF MANUFACTURING A SEMICONDUCTOR DEVICE AND SEMICONDUCTOR DEVICE MANUFACTURED BY MEANS OF THE METHOD

This is a continuation of application Ser. No. 628,373, filed July 5, 1984, now abandoned.

The invention relates to a method of manufacturing a semiconductor device, in which there is formed on a first silicon layer an oxidation-preventing layer on which a second silicon layer is formed, after which the second layer is removed in part and is then oxidized in part during a first oxidation step, wherein the part of the oxidation-preventing layer not covered by the oxidized second silicon layer and located above a first part of the first silicon layer is selectively removed and the oxide present on the second silicon layer is removed by etching, the first part of the first silicon layer and the remaining part of the second silicon layer are thermally oxidized during a second oxidation step, the uncovered part of the oxidation-preventing layer is removed by etching, and then, a groove is etched into the exposed part of the first silicon layer, which groove separates the first part of the first silicon layer from the remaining second part.

The invention further relates to a semiconductor device manufactured by means of the method.

A method of the kind described above is known from published British Patent Application No. 2111304 of the Applicant corresponding to U.S. Pat. No. 4,449,287. In this application a method is described of forming very narrow grooves or slots in a semiconductor substrate, in which the width of the grooves is determined by a narrow oxide edge obtained by thermal oxidation of a silicon layer, in particular a polycrystalline silicon layer. According to an embodiment of this method, first the aforementioned second silicon layer is partly oxidized over its entire surface and then during oxidation of the exposed first part of the first silicon layer and of the remaining part of the second silicon layer the latter layer is entirely converted into oxide.

Under given circumstances difficulties may be involved in carrying out this method, which occur especially when the first silicon layer is used to form gate electrodes on a subjacent oxide layer, for example in field effect devices, such as MOS transistors, and charge-coupled devices (CCD's). In the first place, after the first oxidation step the remaining part of the second silicon layer should have a thickness of at least 0.1 to 0.2 μm because of the spread in the thickness of the originally provided second silicon layer. During the second oxidation step at least 0.2 μm is therefore removed from the first silicon layer by oxidation and this removed amount will often be even larger because the first silicon layer is mostly heavily doped in order to keep the gate electrode resistance as low as possible, while heavily n-doped silicon oxidizes more rapidly than undoped or weakly doped silicon. Furthermore, after the first silicon layer has been etched for forming the gate electrodes, the oxide has to be removed from the anti-oxidation layer, in which event without the use of an additional masking the gate oxide exposed inside the groove would also be removed and would also be attacked under the gate electrodes by under-etching.

The invention has inter alia for its object to provide an improved method, in which without additional masking steps the difficulties described above are avoided.

The invention is based inter alia on the recognition of the fact that this can be achieved by making use of the difference in rate of oxidation between heavily n-doped silicon and undoped or weakly doped silicon.

According to the invention, a method of the kind described in the opening paragraph is characterized in that at least the first part of the first silicon layer is strongly n-type conducting and has a higher doping concentration that at least the remaining part of the second silicon layer, as a result of which during the second oxidation step only a thin oxide layer is formed on the second silicon layer and a thicker oxide layer is formed on the first silicon layer, in that then, after removing the uncovered part of the oxidation-preventing layer, by mask-free etching, the oxide layer of the second silicon layer is entirely removed and that of the first silicon layer is only partly removed and in that during the step of etching the groove the remaining part of the second silicon layer located above the second part of the first silicon layer is also removed.

In the method according to the invention, only three layers and essentially only one masking step are required, while the aforementioned disadvantages of the known method are avoided, as will be explained more fully hereinafter.

It is further to be noted that when in this Application the term "undoped silicon" is used, this means that dopants are not intentionally added to the silicon.

Although the first silicon layer as a whole may have a strong n-type doping, a preferred embodiment is characterized in that the oxidation-preventing layer is formed on a practically undoped first silicon layer, after which the first part of the first silicon layer not covered by the oxidized second silicon layer is given a high n-type doping with the oxide on the second silicon layer masking against this doping.

The first and second silicon layers preferably consist of non-monocrystalline silicon including amorphous silicon which in this Application is generally designated by the term "polycrystalline". The second oxidation step is preferably carried out in steam between 700° C. and 800° C. The difference in rate of oxidation between highly doped n-type silicon and undoped silicon may be a factor 10 or more.

Figure 26:
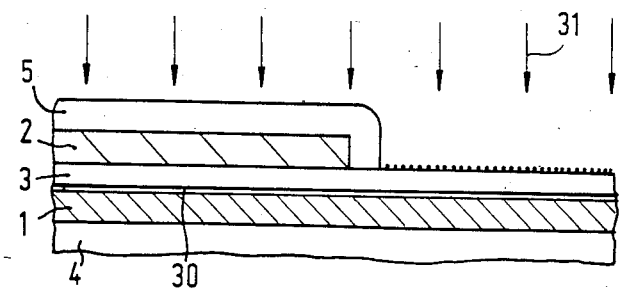
Figure 27:
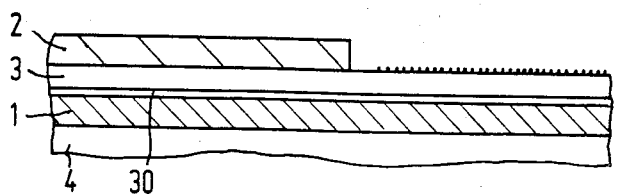
Figure 28:
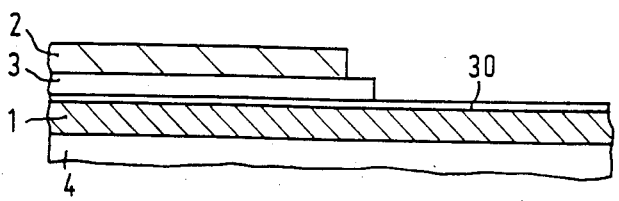

The invention will now be described more fully with reference to a few embodiments and the drawing, in which FIGS. 1 to 9 show diagrammatically in cross-section successive stages in the manufacture of a semiconductor device according to the invention;

FIGS. 10 to 16 show another embodiment of the method according to the invention for manufacturing a field effect device, in this case a CCD, FIGS. 17 to 25 illustrate the manufacture of a small bipolar transistor by means of the method according to the invention, and FIGS. 26 to 28 show a modification of the method according to the invention.

The drawings are schematic and not to scale. This more particularly applies to the dimensions in the direction of thickness. Semiconductor regions of the same conductivity type are cross-hatched in the same direction. Corresponding parts are generally denoted by the same reference numerals.

FIGS. 1 to 9 show diagrammatically in cross-section successive stages of an embodiment of the method according to the invention. The starting material (see FIG. 1) is a first silicon layer 1 on which an oxidation-preventing layer 3 is formed which consists, for example, of silicon nitride or silicon oxynitride. A second silicon layer 2 is formed on the layer 3. The assembly is provided on a substrate 4 which consists of an arbitrary material, for example insulating or semiconductor material. The silicon layers 1 and 2 are generally non-monocrystalline. When the substrate 4 consists of monocrystalline semiconductor material, the layer 1 may be under given circumstances a monocrystalline epitaxial layer. In this example, both layers 1 and 2 consist of polycrystalline silicon, which by the use of known techniques is deposited, like the anti-oxidation layer 3, from the gaseous phase.

Figure 3:
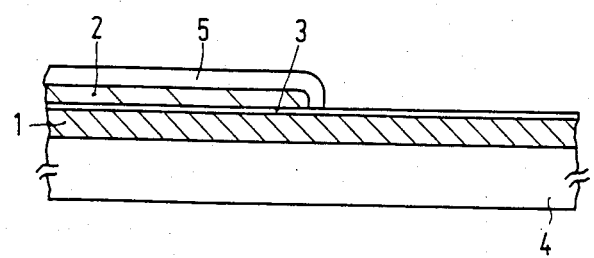

The second silicon layer 2 (see FIG. 2) is now removed in part, after which the remaining part of the layer 2 is oxidized in part and converted into silicon oxide 5 during a first oxidation step (see FIG. 3). In this example, the silicon layer 1 has a thickness of 0.5 μm and the silicon layer 2 has a thickness of 0.7 μm while the intermediate layer 3 has a thickness of 0.1 μm and consists of silicon nitride. The first oxidation step is effected at 1000° C. in steam for 120 minutes. The non-oxidized part of the layer 2 after this oxidation has a thickness of about 0.45 μm and the oxide layer 5 has on the layer 2 a thickness of about 0.6 μm.

Figure 4:
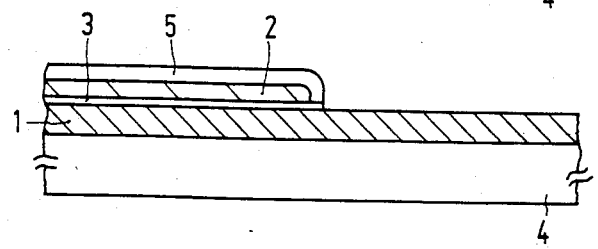

Subsequently, the part of the oxidation-preventing layer 3 not covered by the oxidized second silicon layer (2,5) is selectively removed by etching in, for example, hot phosphoric acid with a first part 1A of the first silicon layer 1 being exposed; see FIG. 4. The oxide 5 is then removed by etching in a solution of HF in water; see FIG. 5. A small part of the layer 3 corresponding to the width of the oxidized edge 5 of the layer 2 then projects from beneath the layer 2. During a second oxidation step at a temperature between 700° C. and 800° C., in this example at 750° C. for 60 minutes in steam, the exposed first part 1A of the first silicon layer 1 and the remaining part of the second silicon layer 2 are thermally oxidized, an oxide layer 6 being formed on the layer 2 and an oxide layer 7 being formed on the layer 1; see FIG. 6.

According to the invention, during this second oxidation step, only a thin oxide layer 6 is formed on the remaining part of the second silicon layer 2 due to the fact that the doping of the second silicon layer 2, at least that of the part remaining after the first oxidation step, is lower than the n-type doping of the exposed first part 1A of the first silicon layer 1. In this example, the layer 2 is practically undoped, whereas the layer 1 is heavily n-doped (doping $7.10^{20}$ atoms/cm$^3$). Since this heavily n-doped silicon oxidizes at a considerably higher rate than the weakly (not intentionally) doped silicon of the layer 2, the oxide layer 7 becomes considerably thicker (about 150 nm) than the oxide layer 6 (about 15 nm).

The uncovered part of the oxidation-preventing layer 3 is now selectively etched away (see FIG. 7) in, for example, hot phosphoric acid, a narrow strip of the silicon layer 1 being exposed. According to the invention, by mask-free etching the oxide layer 6 of the second silicon layer 2 is removed entirely and the thicker oxide layer 7 of the first silicon layer 1 is removed only in part; see FIG. 8. This may be effected by, for example, dip-etching in a 1% HF solution. Subsequently, a groove 8 is etched into the exposed part of the first semiconductor layer 1, for example, by selective etching in a chlorine plasma (see FIG. 9) which groove extends over the entire thickness or over only part of the thickness of the layer 1 and separates the first part 1A from the remaining second part 1B of the silicon layer 1. This etching process, which is also carried out without a mask, in accordance with the invention is continued until the remaining part of the second silicon layer 2 has also disappeared.

In the process described, only one masking step is used. The width of the groove 8 is determined by the thickness of the oxide layer 5.

Furthermore, due to the fairly light second oxidation step, only a small part of the silicon layer 1 is removed. Since after the groove 8 has been etched, the silicon layer 2 has also disappeared completely, an etching process that could attack any oxide layer present under the groove 8 can be omitted.

In FIGS. 1 to 9 the principle of the method according to the invention is illustrated. With the use of this method, a variety of semiconductor devices can be manufactured. Many variations can be used in carrying out the method. For example, one or more of the etching steps described may be carried out by means of plasma-etching.

Figure 10:
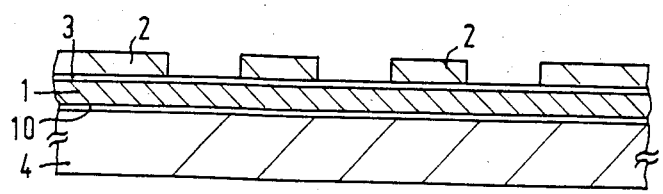

FIGS. 10 to 16 show diagrammatically in cross-section successive stages in the manufacture of the electrode structure of a CCD or charge-coupled device by the use of the method according to the invention. The starting material (see FIG. 10) is a p-type silicon substrate 4, on which an oxide layer 10 having a thickness of 70 nm is formed by thermal oxidation. There is deposited on the layer 10 a first silicon layer 1, which is then rendered strongly n-type conducting (doping $7.10^{20}$ atoms/cm$^3$) by diffusion or by ion implantation or during its growth. The thickness of the layer 1 is, for example, 0.5 μm. On this layer 1 there is deposited an oxidation-preventing layer 3 of, for example, silicon nitride or silicon oxynitride having a thickness of about 0.1 μm. On this layer finally, there is deposited a second silicon layer 2, which is undoped and has a thickness of, for example, 0.7 μm. This layer 2 is subdivided into strip-shaped parts by masking and etching, the edges of these parts approximately corresponding to the edges of the gate electrode structure to be ultimately formed. Thus, the situation shown in FIG. 10 is obtained.

Figure 11:
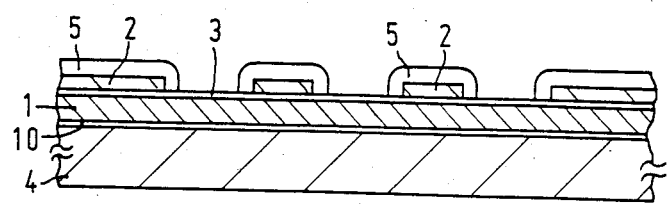

Subsequently, a first thermal oxidation step is carried out at 1000° C. for 120 minutes in steam with a part of the silicon layer 2 being converted into the 0.6 μm thick silicon oxide layer 5; see FIG. 11.

Figure 12:
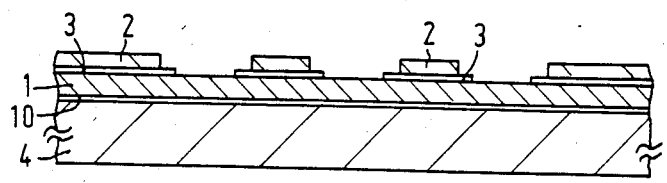

For example, by etching in a plasma or in hot phosphoric acid, the uncovered part of the silicon nitride or oxynitride layer 3 is then removed, after which the oxide 5 is removed in, for example, a HF solution in water. Thus, the structure of FIG. 12 is obtained.

Figure 13:
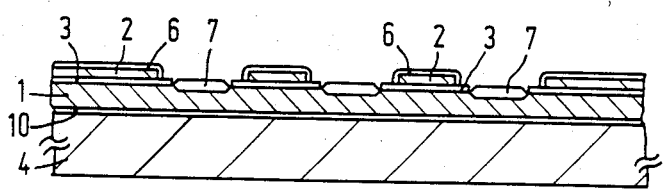

By thermal oxidation at comparatively low temperature, for example at 750° C., in steam, a thin oxide layer 6 is now formed on the undoped silicon layer 2 and an about ten times thicker oxide layer 7 is formed on the heavily n-doped silicon layer 1; see FIG. 13. The thicknesses of the layers 6 and 7 may be, for example, 15 nm and 150 nm, respectively.

Figure 14:
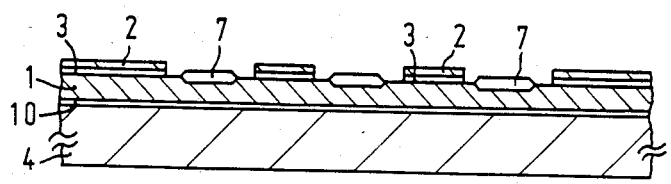

Subsequently, the oxide layer 6 is etched away entirely and the oxide layer 7 is etched away only over part of its thickness by dip-etching in a 1% hydrofluoride solution. After the uncovered parts of the nitride layer 3 have been selectively etched away also without a mask, the situation shown in FIG. 14 is obtained.

Figure 15:
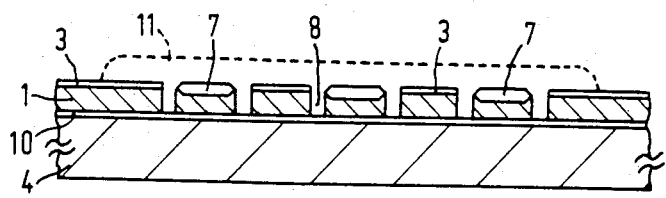
Figure 16:
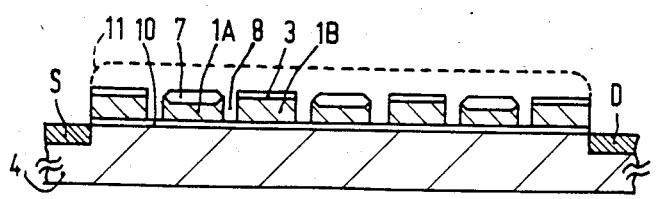

Subsequently, the first silicon layer 1 is etched through its entire thickness down to the oxide 10. This may be effected by plasma-etching, for example in a chlorine plasma. The remaining part of the second silicon layer 2 then also disappears so that the structure shown in FIG. 15 is obtained comprising a number of strip-shaped silicon electrodes which are located very closely to each other, are separated from each other by grooves 8, and are covered alternately (1B) by nitride 3 or (1A) by oxide 7. The intermediate space between the electrodes is determined by the thickness of the oxide layer 5. After etching by means of a photolacquer mask 11 indicated by dotted lines, if desired, source and drain zones S and D with a high n-type doping may be formed at the ends of the electrode structure by means of ion implantation.

Instead of the steps described above, starting from the situation shown in FIG. 13, after removal of the exposed silicon nitride 3, in a continuous etching process first and oxide layer 6 may be removed in, for example, a $CCl_4$ (carbon tetrachloride) plasma and then the step of etching the silicon layer 1 may be continued and completed in a chlorine plasma while simultaneously etching away the remaining silicon layer 2.

It should further be noted that actually the number of gate electrodes in a CCD is considerably larger than is shown in the drawing and that a great variety of types of charge-coupled devices and other field effect devices can be manufactured by means of methods in accordance with the invention. The electrical connections of the gate electrodes and the source and drain zones are not shown in the drawing for the sake of simplicity because they are not relevant to the invention.

The method according to the invention is also particularly suitable for the manufacture of bipolar semiconductor devices, for example small bipolar transistors having closely adjacent base and emitter connections. An example thereof will be described with reference to FIGS. 17 to 25.

Figure 17:
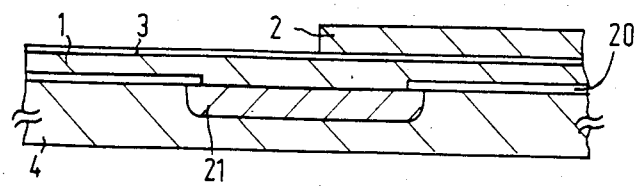

On an n-type substrate region 4, which constitutes the collector zone of the transistor, there is grown a thermal oxide layer 20 into which a window is etched; see FIG. 17. In this window a base zone 21 is diffused or implanted. As in the preceding examples, a first undoped silicon layer 1 is now deposited in a usual manner from the gaseous phase on the substrate 4 covered partly by the oxide layer 20 and comprising the base zone 21. Again as in the preceding examples, there is formed on the layer 1 an oxidation-preventing silicon nitride layer or silicon oxynitride layer 3 on which a second undoped silicon layer 2 is deposited. This silicon layer 2 is removed in part by masking and etching with the edge of the remaining part of the layer 2 being located inside the window in the oxide layer 20. Thus, the situation shown in FIG. 17 is obtained.

Figure 18:
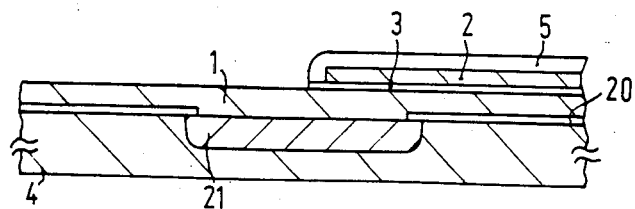
Figure 19:
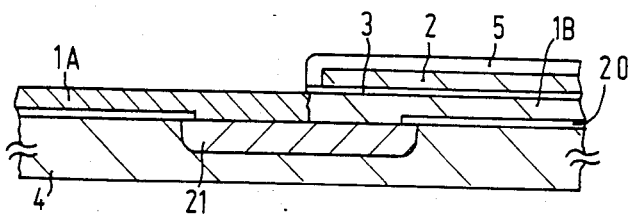

Subsequently, in a first oxidation step at 1000° C. for 20 minutes in steam the layer 2 is provided with a 0.6 μm thick oxide layer 5, after which the exposed part of the nitride layer 3 is etched away without masking while using the oxidized silicon layer (2,5) as a mask; see FIG. 18.

By means of diffusion or ion implantation, the exposed part 1A of the layer 1 is then heavily n-doped (doping $7 \times 10^{20}$ atoms/cm$^3$). In this example, this is effected by implantation of phosphorus or arsenic ions. The oxide layer 5 then serves as a mask so that the subjacent layer 2 and the part 1B of the layer 1 are not doped; see FIG. 19.

Figure 20:
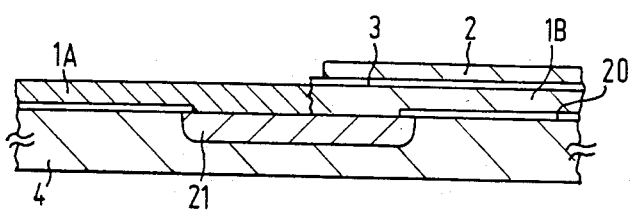
Figure 21:
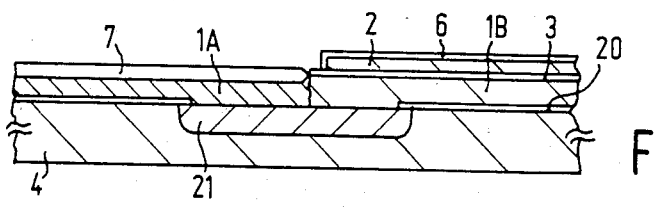

The oxide 5 is then removed in a HF solution; see FIG. 20. By a second oxidation step at 750° C. in steam for 60 minutes, a thin oxide layer 6 about 15 nm thick is formed on the undoped second silicon layer 2 and a thicker oxide layer 7 about 150 nm thick is formed on the exposed heavily n-doped first part 1A of the first silicon layer 1; see FIG. 21.

Figure 22:
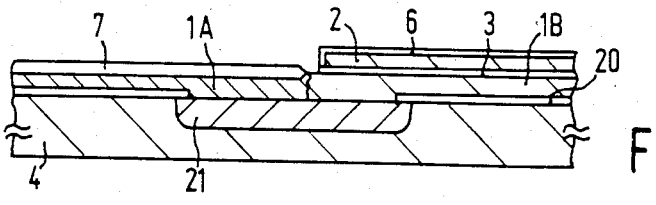
Figure 23:
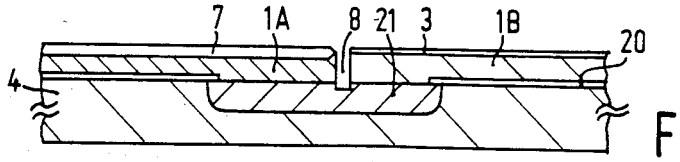

The uncovered part of the oxidation-preventing layer 3 is now selectively removed by etching; see FIG. 22. By dip-etching in a 1% HF solution the thin oxide layer 6 is then removed, the thicker oxide layer 7 being attacked only superficially. By etching in, for example, a chlorine plasma, a groove 8 is then etched into the layer 1 (see FIG. 23), which groove separates the first part 1A from the remaining second part 1B. The groove 8 extends through the entire thickness of the layer 1 into the base zone 21. The remaining part of the second silicon layer 2 then also disappears.

Figure 24:
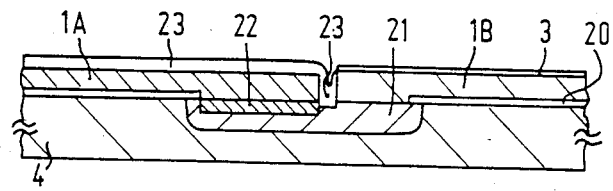
Figure 25:
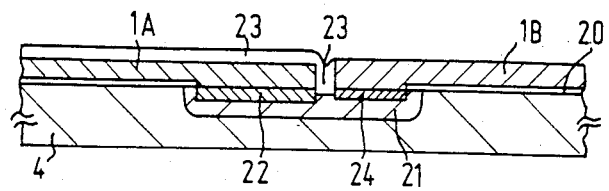

Then, if desired after etching away the oxide layer 7, a third thermal oxidation step is carried out at 1000° C. for 30 minutes in steam resulting in the layer 1A and the wall and bottom of the groove 8 being covered by an oxide layer 23; see FIG. 24. By diffusion from the part 1A the n-type emitter zone 22 is obtained. Subsequently, the nitride layer 3 is etched away selectively, after which the part 1B of the silicon layer 1 is rendered strongly p-type conducting (doping $5 \times 10^{19}$ atoms/cm$^3$) by implantation of boron ions. A p-type base contact zone 24 may then also be formed; see FIG. 25. Thus, a transistor of very small dimensions is obtained, the distance between the emitter connection 1A and the base connection 1B being determined by the thickness of the oxide layer 5.

Figure 5:
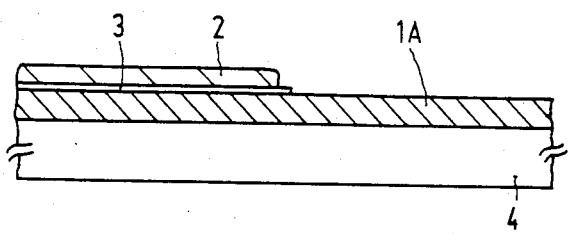
Figure 6:
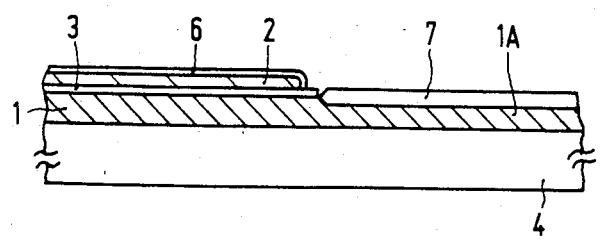
Figure 7:
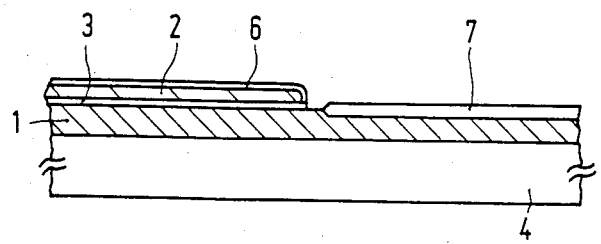
Figure 8:
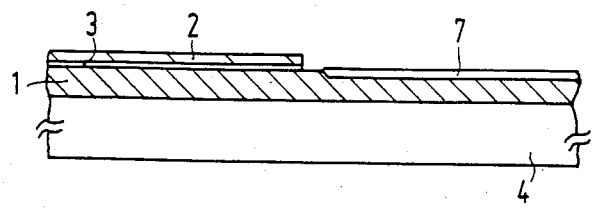
Figure 9:
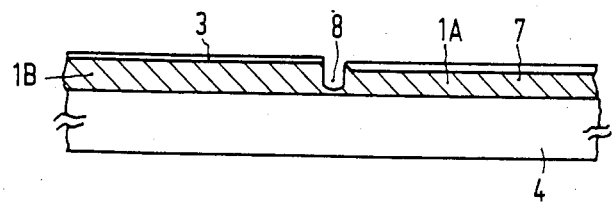

The invention is not restricted to the embodiments described above. For example, many other semiconductor devices than those described here may be manufactured by means of the method according to the invention. Furthermore, the oxidation-preventing layer may consist of materials other than silicon nitride or silicon oxynitride. More particularly, in order to prevent lattice defects, a silicon nitride layer with an underlying thin silicon oxide layer is used. Inter alia in order to prevent underetching problems, in this case a slightly different method may be used in order of succession of FIGS. 1 to 9, starting from FIG. 3. This will be illustrated with reference to FIGS. 26 to 28. FIG. 26 corresponds to FIG. 3, but in this case a thin silicon oxide layer 30 is provided between the silicon nitride layer 3 (which is shown with a larger thickness for the sake of clarity) and the silicon layer 1. A bombardment with energetic particles, for example nitrogen ions, in the direction of the arrows 31 ensures that the bombarded nitride (indicated in dotted lines in FIG. 26) can be etched more rapidly. The oxide 5 masks against this bombardment. After etching away the oxide 5 (FIG. 27) the exposed nitride is etched in hot phosphoric acid. The bombarded nitride that can be etched more rapidly then disappears completely, but the non-bombarded nitride masked by the oxide 5 disappears only for a small part; see FIG. 28. Thus, the situation corresponding to FIG. 5 is obtained, after which the method can be continued in the same manner as in FIGS. 6 to 9.

What is claimed is:

1. A method of manufacturing a semiconductor device comprising the steps of
    forming an oxidation-preventing layer on a first layer of silicon,
    forming a second layer of silicon on said oxidation-preventing layer, removing at least one portion of said second silicon layer from said oxidation-preventing layer, oxidizing all exposed surfaces of the remaining parts of said second silicon layer, removing exposed portions of said oxidation-preventing layer on said first silicon layer, removing the oxidized surface parts of said second silicon layer by etching, thermally oxidizing exposed portions of said first silicon layer and said remaining exposed parts of said second silicon layer to form a thick oxide layer on said first silicon layer and a thinner oxide layer on said remaining parts of said second silicon layer such that the thinner oxide layer does not entirely cover the remaining exposed portion of said oxidation-preventing layer, removing the exposed portion of said oxidation-preventing layer by etching, entirely removing said thinner oxide layer on said remaining parts of said second silicon layer by mask-free etching, wherein the upper portion of said thick oxide layer is removed while the lower portion of said thick oxide layer remains on said first silicon layer, etching at least one groove into said first silicon layer at said removed portion of said oxidation-preventing layer, said groove separating a first part of said first silicon layer from a second part of said first silicon layer, said first part of said first silicon layer being strongly n-type conducting, and said first part having a higher doping concentration than at least said remaining part of said second silicon layer, and during said etching of at least one groove, removing said remaining parts of said second silicon layer.

2. A method according to claim 1, wherein said thinner oxide layer on said remaining part of said second silicon layer is removed in a first plasma after removing said exposed portion of said oxidation-preventing layer, and wherein said groove is etched by a second plasma in a continuous etching process.

3. A method according to claim 2, wherein said first plasma is a carbon tetrachloride (CCl₄) plasma, and said second plasma is a chlorine plasma.

4. A method according to claim 1 or claim 2 or claim 3, wherein said step of thermally oxidizing said first silicon layer and said remaining part of said second silicon layer is carried out in steam at a temperature between 700° C. and 800° C.

5. A method according to claim 1 or claim 2 or claim 3 wherein said first silicon layer is undoped upon said step of forming said oxidation-preventing layer, and wherein after the first step of oxidizing said remaining part of said second silicon layer, said first silicon layer free of said second silicon layer is given a high n-doping to form said first part, said oxide on said remaining part of said second silicon layer masking against said doping.

6. A method according to claim 5, wherein said first silicon layer is provided on a p-type base zone of a bipolar transistor formed in an n-type collector region through an oxide window, wherein said first part of said first silicon layer has an edge located inside said oxide window, wherein upon diffusion from said first part an n-type emitter zone is formed in said base zone, wherein said groove is covered by a thermal oxide layer, and wherein remaining parts of said oxidation-preventing layer are then removed, said second part of said first silicon layer then being given a high p-type doping.

7. A method according to claim 1 or claim 2 or claim 3, wherein said groove is etched through the entire thickness of said first silicon layer.

8. A method according to claim 1 or claim 2 or claim 3, wherein said groove is covered by an oxide layer obtained by a second thermal oxidation.

9. A method according to claim 1 or claim 2 or claim 3, wherein said first silicon layer is provided on a semiconductor substrate covered by an oxide layer, and wherein said step of etching said grooves subdivides said first silicon layer into a number of insulated gate electrodes of a field effect device.

10. A method according to claim 1 or claim 2 or claim 3, wherein said first part of said first silicon layer is highly doped with n-type dopant to at least $2 \times 10^{20}$ atoms/cm³.

11. A method according to claim 1 or claim 2 or claim 3, wherein said groove has a thickness of the order of 0.6 microns.

12. A method according to claim 1 or claim 2 or claim 3, wherein said groove has substantially vertical walls.

* * * * *